(12) United States Patent
Prejbeanu et al.

(10) Patent No.: US 9,165,626 B2
(45) Date of Patent: Oct. 20, 2015

(54) SELF-REFERENCE MAGNETIC RANDOM ACCESS MEMORY (MRAM) CELL COMPRISING FERRIMAGNETIC LAYERS

(71) Applicant: Crocus Technology SA, Grenoble Cedex (FR)

(72) Inventors: Ioan Lucian Prejbeanu, Seyssinet Pariset (FR); Lucien Lombard, Grenoble (FR)

(73) Assignee: CROCUS TECHNOLOGY SA, Grenoble Cedex (FR)

( * ) Notice: Subject to any disclaimer, the term of this patent is extended or adjusted under 35 U.S.C. 154(b) by 503 days.

(21) Appl. No.: 13/625,923

(22) Filed: Sep. 25, 2012

(65) Prior Publication Data

US 2013/0083593 A1 Apr. 4, 2013

(30) Foreign Application Priority Data

Sep. 30, 2011 (EP) ..................................... 11290456

(51) Int. Cl.
*G11C 11/00* (2006.01)
*G11C 11/16* (2006.01)

(52) U.S. Cl.
CPC ................ *G11C 11/16* (2013.01); *G11C 11/00* (2013.01); *G11C 11/1675* (2013.01)

(58) Field of Classification Search
CPC ..... G11C 11/1675; G11C 11/16; G11C 11/00
USPC .............................. 365/158, 171, 173, 189.16
See application file for complete search history.

(56) References Cited

U.S. PATENT DOCUMENTS

| 7,276,384 | B2 * | 10/2007 | Parkin et al. | 438/3 |
| 8,102,071 | B2 * | 1/2012 | Catlin | 290/54 |
| 8,169,815 | B2 * | 5/2012 | Javerliac et al. | 365/158 |
| 8,228,716 | B2 * | 7/2012 | Nozieres et al. | 365/158 |
| 8,717,812 | B2 * | 5/2014 | Mackay et al. | 365/171 |
| 8,743,097 | B2 * | 6/2014 | Shang | 345/206 |
| 8,824,202 | B2 * | 9/2014 | Berger et al. | 365/171 |
| 2014/0269042 | A1 * | 9/2014 | Berger et al. | 365/158 |

FOREIGN PATENT DOCUMENTS

| EP | 1553601 A2 | 7/2005 |
| EP | 2276034 A2 | 1/2011 |
| WO | 2009/074411 A1 | 6/2009 |

OTHER PUBLICATIONS

Extended European search report dated Jun. 26, 2012 for application EP11290456.

* cited by examiner

*Primary Examiner* — Gene Auduong
(74) *Attorney, Agent, or Firm* — Pearne & Gordon LLP

(57) ABSTRACT

MRAM cell comprising a magnetic tunnel junction comprising a storage layer having a net storage magnetization being adjustable when the magnetic tunnel junction is at a high temperature threshold and being pinned at a low temperature threshold; a sense layer having a reversible sense magnetization; and a tunnel barrier layer between the sense and storage layers; at least one of the storage and sense layer comprising a ferrimagnetic 3d-4f amorphous alloy material comprising a sub-lattice of 3d transition metals atoms providing a first magnetization and a sub-lattice of 4f rare-earth atoms providing a second magnetization, such that at a compensation temperature of said at least one of the storage layer and the sense layer, the first magnetization and the second magnetization are substantially equal. The disclosed MRAM cell can be written and read using a small writing and reading field, respectively.

9 Claims, 3 Drawing Sheets

SELF-REFERENCE MAGNETIC RANDOM ACCESS MEMORY (MRAM) CELL COMPRISING FERRIMAGNETIC LAYERS

FIELD

The present invention concerns a self-referenced magnetic random access memory (MRAM) cell using a ferrimagnetic sense and/or storage layer having a low switching field. The present invention also pertains to a method for writing the MRAM cell and a self-referenced method for reading the MRAM cell, such that the MRAM cell can be written and read using a small writing and reading field, respectively.

DESCRIPTION OF RELATED ART

Magnetic random access memory (MRAM) cells using the so-called self-referenced reading operation typically comprise a magnetic tunnel junction formed of a magnetic storage layer having a magnetization which direction can be changed from a first stable direction to a second stable direction, a thin insulating layer, and a sense layer having a reversible direction. Self-referenced MRAM cells allows for performing the write and read operation with low power consumption and an increased speed.

However, during the write operation a dipolar coupling between the storage and sense layers occurs due to local magnetic stray field, coupling the magnetization of the sense layer with the one of the storage layer in a closed magnetic flux configuration. Switching the storage layer magnetization during the write operation will then require applying a magnetic field high enough to overcome the dipolar coupling. The dipolar coupling results in a shift (or bias) of the hysteresis loop when applying a field cycle to measure the hysteresis loop of the storage layer. This dipolar coupling depends on the thickness and magnetization of the storage and sense layers, and on the size of the magnetic tunnel junction. In particular, dipolar coupling increases with decreasing the magnetic tunnel junction diameter and can thus become a major issue when scaling down the MRAM cell.

SUMMARY

The present disclosure concerns a magnetic tunnel junction based random access memory (MRAM) cell comprising a magnetic tunnel junction comprising a storage layer having a net storage magnetization that is adjustable from a first direction to a second direction when the magnetic tunnel junction is heated at a high temperature threshold and that is pinned at a low temperature threshold; a sense layer having a sense magnetization that is reversible under an applied magnetic field; and a tunnel barrier layer separating the sense layer from the storage layer. At least one of the storage layer and the sense layer comprises a ferrimagnetic 3d-4f amorphous alloy material comprising a sub-lattice of 3d transition metals atoms providing a first magnetization, and a sub-lattice of 4f rare-earth atoms providing a second magnetization, such that at a compensation temperature of said at least one of the storage layer and sense layer, the first magnetization and the second magnetization are substantially equal.

In an embodiment, the sense layer comprises the ferrimagnetic 3d-4f amorphous alloy material, the first magnetization being a first sense magnetization and the second magnetization being a second sense magnetization; and wherein the compensation temperature of the sense layer corresponds substantially to the high temperature threshold.

In another embodiment, the storage layer comprises the ferrimagnetic 3d-4f amorphous alloy material the first magnetization being a first storage magnetization and the second magnetization being a second storage magnetization; and wherein the compensation temperature of the storage layer corresponds substantially to the low temperature threshold.

In yet another embodiment, the sense layer comprises the ferrimagnetic 3d-4f amorphous alloy material providing the first and second magnetizations, and the storage layer comprises the ferrimagnetic 3d-4f amorphous alloy material providing the first and second magnetizations, and wherein the compensation temperature of the storage layer is greater than the compensation temperature of the sense layer.

In yet another embodiment, the compensation temperature of the storage layer corresponds substantially to the low temperature threshold and the compensation temperature of the sense layer corresponds substantially to the high temperature threshold.

In yet another embodiment, the compensation temperature can be adjusted according to the relative compositions between the transition metal 3d sub-lattice and the rare-earth 4f sub-lattice.

In yet another embodiment, the ferrimagnetic material comprises an alloy containing Co or Fe with Gd, Sm, or Tb.

The present disclosure also pertains to a method for writing the MRAM cell, comprising:

heating the magnetic tunnel junction to the high temperature threshold;

once the magnetic tunnel junction has reached the high temperature threshold, switching the magnetization direction of the storage layer to write data to said storage layer;

the high temperature threshold corresponding substantially to the compensation temperature.

The present disclosure further concerns a method for reading the MRAM cell, comprising:

aligning the net sense magnetization in a first direction;

measuring a first resistance of said magnetic tunnel junction, the first resistance being determined by the first direction of the net sense magnetization relative to the orientation of switched the storage magnetization;

aligning the net sense magnetization in a second direction;

measuring a second resistance of said magnetic tunnel junction, the second resistance being determined by the second direction of the net sense magnetization relative to the orientation of the switched storage magnetization;

determining a difference between the first resistance value and the second resistance value;

aligning the net sense magnetization in the first direction and in the second direction being performed at a read temperature below the compensation temperature.

The disclosed MRAM cell can be written and read using a small writing and reading field, respectively.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS OF THE INVENTION

Figure 1:
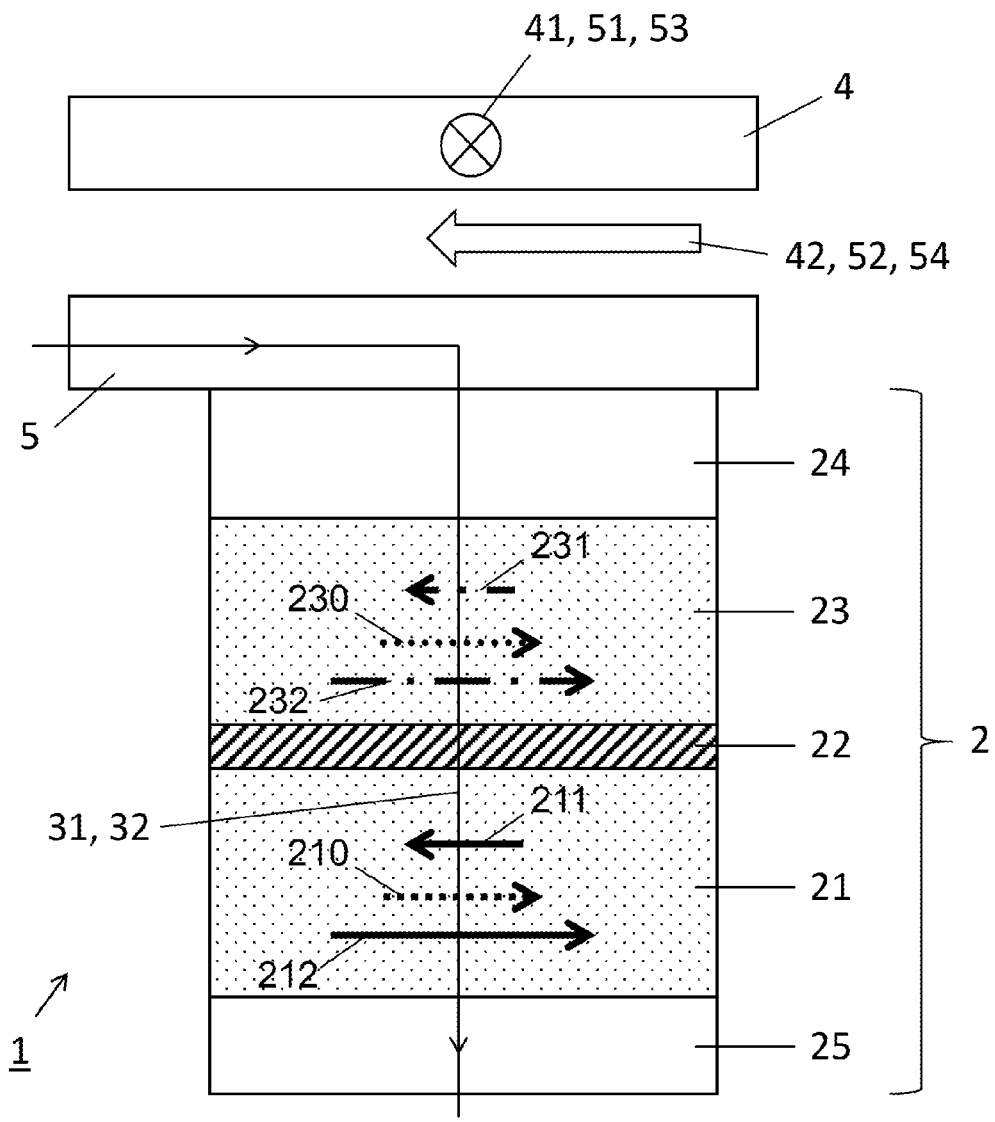
FIG. 1 illustrates a self-referenced random access memory (MRAM) element according to an embodiment.

FIG. 1 illustrates a self-referenced random access memory (MRAM) element 1 according to an embodiment. The MRAM cell 1 comprises a magnetic tunnel junction 2 comprising a ferromagnetic storage layer 23 having a net storage magnetization 230; a ferrimagnetic sense layer 21 having a net sense magnetization 210; and a tunnel barrier layer 22 included between the storage layer 23 and the sense layer 21. The layer 25 represents a metallic contacting electrode. The direction of the storage magnetization 230 is adjustable from a first stable direction to a second stable direction by using a thermally assisted switching (TAS) write operation. In other words, the net storage magnetization 230 can be adjusted when the storage layer 23 is heated at a high temperature threshold, and is pinned at a low temperature threshold. The storage layer 23 may also be made of a ferromagnetic material such as, for example, cobalt iron (CoFe), cobalt iron bore (CoFeB), nickel iron (NiFe), Cobalt (Co), etc. In the embodiment of FIG. 1, the storage layer 23 is exchange-coupled by an antiferromagnetic storage layer 24. The antiferromagnetic storage layer 24 is adapted to pin the net storage magnetization 230 at the low temperature threshold and free the net storage magnetization 230 at the high temperature threshold. The antiferromagnetic layer 24 can be made from a manganese-based alloy, such as IrMn or FeMn, or any other suitable materials. Typically, the high temperature threshold is above room temperature, for example, between 120° C. and 220° C.

The tunnel barrier layer 22 is preferably made of a material selected from the group comprising $Al_2O_3$ and MgO. The tunneling resistance of the magnetic tunnel junction 2 depends exponentially on the insulating layer thickness and is measured by the resistance-area product (RA) of the junction. The RA must sufficiently small in order to flow a current through the junction which is sufficiently high to raise the temperature of the magnetic tunnel junction 2 (storage layer 23 and antiferromagnetic storage layer 24) at the high temperature threshold. The sense layer 21 can be made of a low coercivity, soft ferrimagnetic material including typically iron, cobalt nickel or their alloys. The net sense magnetization 210 of the sense layer 21 is easily reversible, i.e., the net sense magnetization 210 can be adjusted at the low and high temperature threshold.

According to an embodiment, the TAS write operation comprises:
- heating the magnetic tunnel junction 2 to a high temperature threshold;
- once the magnetic tunnel junction 2 has reached the high temperature threshold, switching the net storage magnetization 230 in the written state (write data); and
- cooling the magnetic tunnel junction 2 to the low temperature threshold such as to freeze the net storage magnetization 230 in the written state.

Heating the magnetic tunnel junction 2 can comprise applying a heating current 31 through the magnetic tunnel junction 2, for example, via a current line 5 (as represented in the embodiment of FIG. 1). The high temperature threshold can corresponds to a temperature above the blocking temperature $T_{BS}$ where the exchange coupling between the antiferromagnetic storage layer 24 and the storage layer 23 disappears and the net storage magnetization 230, being no more pinned, can be freely adjusted. Switching the net storage magnetization 230 can comprise applying an external write magnetic field 42, the net storage magnetization 230 being then switched in an orientation according to the direction of the applied magnetic field 42. The write magnetic field 42 can be applied by passing a write current 41 in a field line 4 in communication with the magnetic tunnel junction 2 (as represented in the embodiment of FIG. 1). The field line is typically disposed on top or below the magnetic tunnel junction 2. The low temperature threshold can corresponds to a temperature below the blocking temperature $T_{BS}$ of the antiferromagnetic layer 24 where the antiferromagnetic layer 24 pins the net storage magnetization 230. Cooling the magnetic tunnel junction 2 can comprise inhibiting the heating current 31, for example, after the magnetic tunnel junction 2 has reached the high temperature threshold.

In an embodiment, a self-referenced read operation of the MRAM cell 1 comprises a first read cycle comprising applying a first read magnetic field 52 adapted for aligning the net sense magnetization 210 in a first direction, in accordance with the first orientation of the first read magnetic field 52. The first read magnetic field 52 can be applied by passing a first read field current 51 having a first polarity in the field line 4. The first direction of the net sense magnetization 210 is then compared with the switched net storage magnetization 230 (written data) by passing a sense current 32 though the magnetic tunnel junction 2. The voltage measured across the magnetic tunnel junction 2 yields a corresponding first resistance value $R_1$ of the magnetic tunnel junction 2. In the case the net sense magnetization 210 is aligned substantially parallel to the storage magnetization 230 the first resistance value $R_1$ is small ($R_1=R_{min}$). On the other hand, when the net sense magnetization 210 is aligned substantially antiparallel to the storage magnetization 230 the measured first resistance value is high ($R_1=R_{max}$).

The first resistance value $R_1$ can be compared to a reference resistance typically halfway between $R_{min}$ and $R_{max}$ (as described in patent application EP2276034). Preferably, the read operation of the MRAM cell 1 further comprises a second read cycle comprising applying a second read magnetic field 54 adapted for aligning the net sense magnetization 210 in a second direction opposed to the first direction, in accordance with the second orientation of the second read magnetic field 54. The second read magnetic field 54 can be applied by passing a second read field current 53 having a second polarity in the field line 4. The second direction of the net sense magnetization 210 is then compared with the switched storage magnetization 230 by passing the sense current 32 through the magnetic tunnel junction 2. Measuring a voltage across the magnetic tunnel junction 2 when the sense current 32 is passed through the magnetic tunnel junction 2 yields a corresponding second resistance value $R_2$ of the magnetic tunnel junction 2. The write data can then be determined by a difference between the second resistance value $R_2$, and the first resistance value $R_1$ measured in the first read cycle. The difference between the first and second resistance values $R_1$, $R_2$, is also called magnetic tunnel magnetoresistance or magnetoresistance □R. The difference between the stored first resistance value $R_1$ and the second resistance value $R_2$ can yield a negative or positive magnetoresistance □R.

During the write operation at the high temperature threshold, the storage layer 23 is no more exchange-coupled with the antiferromagnetic layer 24 and the storage magnetization 230 can be freely adjusted. However, dipolar coupling of the storage layer 23 with the sense layer 21 due to the net sense magnetization 210 can induce a local magnetic stray field (not represented) coupling the storage layer 23 with the sense layer 21. Depending on the value of the stray field, thus on the value of the net sense magnetization 210, the storage magnetization 230 can be pinned through the coupling, inhibiting the writing of the MRAM cell 1. In other words, the applied write magnetic field 42 is not able to overcome the dipolar coupling of the storage layer 23 by the sense layer 21 unless the magnitude of the applied write magnetic field 42 is increased.

The net storage magnetization 230 can also induce a local magnetic stray field (also not represented) coupling the storage layer 23 with the sense layer 21. During the read operation, an increased magnitude of the first and second read magnetic fields 52, 54 may be required due to this dipolar coupling of the storage layer 23 with the sense layer 21 due to the storage magnetization 230.

Figure 2:
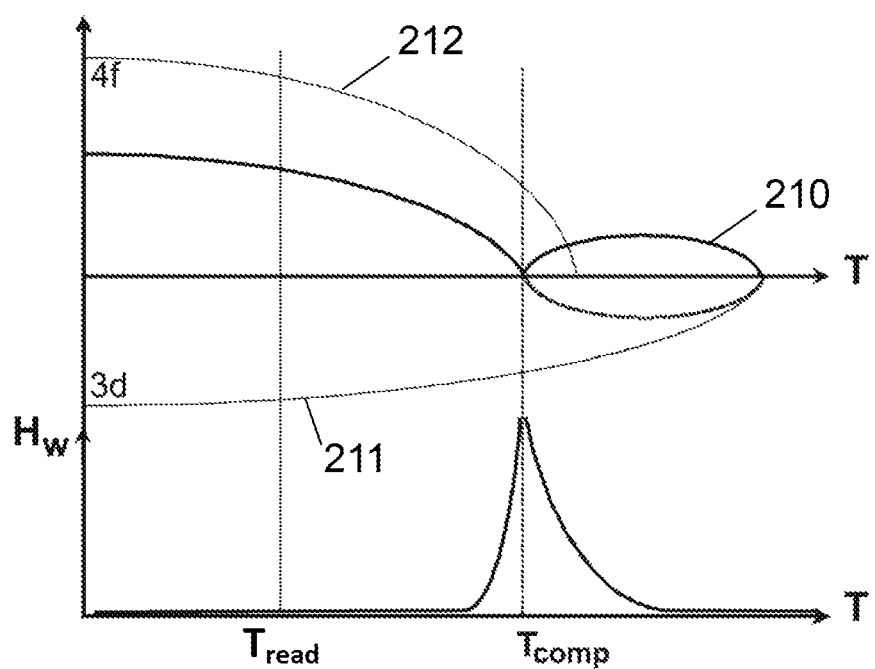
FIG. 2 reports the temperature dependence of the magnetization of a ferrimagnetic layer used either as a sense layer or as a storage layer in the MRAM cell, according to an embodiment.

In an embodiment, the sense layer 21 comprises a ferrimagnetic 3d-4f amorphous alloy. The ferrimagnetic 3d-4f amorphous alloy can be provided by selecting adequate elements and relative compositions between a 3d transition metal and a 4f rare-earth material. Such ferrimagnetic 3d-4f amorphous material used in MRAM devices is described in document EP2232495A1 for a different purpose that the ones disclosed here. More particularly, the ferrimagnetic 3d-4f amorphous alloy of the sense layer 21 comprises a sub-lattice of 3d transition metals atoms providing a first sense magnetization, here a first sense magnetization 211, and a sub-lattice of 4f rare-earth atoms providing a second magnetization, here a second sense magnetization 212. The net sense magnetization 210 of the sense layer 21 is thus the vectorial sum of the first sense magnetization 211 and the second sense magnetization 212. FIG. 2 reports the temperature dependence of the magnetization of the sense layer 21 made from the ferrimagnetic 3d-4f amorphous alloy. More particularly, the figure reports absolute values of a first sense magnetization 211 of the sub-lattice of 3d transition metals atoms, and absolute values of a second sense magnetization 212 of the sub-lattice of 4f transition metals atoms, as a function of temperature. The net sense magnetization 210 as a function of temperature is also reported. In the example of FIG. 2, the respective compositions of the 3d transition metal sub-lattice and the 4f rare-earth material sub-lattice have been chosen such that the first sense magnetization 211 is oriented antiparallel to the second sense magnetization 212. At a compensation temperature $T_{COMP}$ of the sense layer 21, the first sense magnetization 211 and the second sense magnetization 212 have substantially equal amplitudes and opposite signs. In these conditions, the first and second sense magnetization 211, 212 are compensated and the net sense magnetization 210 becomes substantially zero.

Below the compensation temperature $T_{COMP}$ the second sense magnetization 212 becomes larger than the first sense magnetization 211 and the net sense magnetization 210 is oriented in the direction of the second sense magnetization 212. Conversely, at a temperature above the compensation temperature $T_{COMP}$ the first sense magnetization 211 is larger than the second sense magnetization 212 and the net sense magnetization 210 is oriented in the direction of the first sense magnetization 211. As the temperature is increased at or above the Curie temperature $T_{CW}$ of the sense layer 21, thermal fluctuations are such that the net sense magnetization 210 becomes substantially zero and the sense layer 21 becomes paramagnetic. Also shown in FIG. 2 is the coercive field $H_W$ of the sense layer 21. At the compensation temperature $T_{COMP}$ the coercive field $H_W$ diverges and increases theoretically to infinity. On either side of the compensation temperature $T_{COMP}$, the coercive field $H_W$ decreases all the faster as the temperature is close to the compensation temperature $T_{COMP}$.

In a preferred embodiment, the compensation temperature $T_{COMP}$ of the sense layer 21 corresponds substantially to the high temperature threshold. During the write operation at the high temperature threshold, the net sense magnetization 210 is substantially zero, and no coupling of the storage layer 23 by the sense layer 21 occurs. Consequently, the sense magnetization 230 can be switched easily using the applied write magnetic field 42 having a small magnitude.

The read operation is performed at a read temperature $T_{read}$ below the compensation temperature $T_{COMP}$. The read temperature $T_{read}$ corresponds to the low temperature threshold at which the storage magnetization 230 is pinned by the antiferromagnetic layer 24, so that the first and second read magnetic field 52, 54 cannot switch the storage magnetization 230. During the read operation, the storage magnetization 230 is pinned by the antiferromagnetic layer 24 such that it cannot be switched by the first and second read magnetic field 52, 54.

Preferably, the ferrimagnetic 3d-4f amorphous alloy comprises an alloy containing Co or Fe with Gd, Sm, or Tb such as, for example, GdCo, SmCo or TbFeCo. The compensation temperature $T_{COMP}$ can be adjusted according to the ferrimagnetic material alloy composition. For example, the compensation temperature $T_{COMP}$ can be adjusted by selecting the relative compositions between a 3d transition metal and a 4f rare-earth material.

An advantage of the MRAM cell 1 disclosed herein and of the write operation method is that, during the write operation the storage magnetization 230 can be switched using the write magnetic field 42 having a low magnitude, due to the low, or null, stray field at the compensation temperature $T_{COMP}$. Moreover, during the read operation the magnitude of the first and second read magnetic field 52, 54 can be small since the net sense magnetization 210 is easily reversible.

Figure 3:
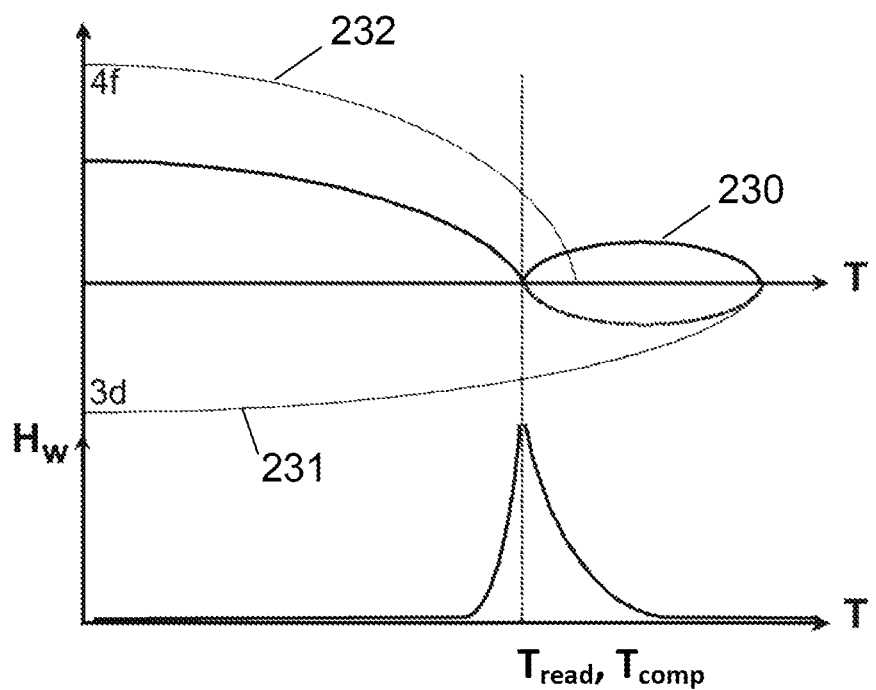
FIG. 3 reports the temperature dependence of the magnetization of a ferrimagnetic layer used either as a sense layer or as a storage layer in the MRAM cell, according to another embodiment.

In another embodiment, the storage layer 23 comprises the ferrimagnetic 3d-4f amorphous alloy. More particularly, the ferrimagnetic 3d-4f amorphous alloy of the storage layer 23 comprises a sub-lattice of 3d transition metals atoms providing the first magnetization, here a first storage magnetization 231, and a sub-lattice of 4f rare-earth atoms providing the second magnetization, here a second storage magnetization 232. The net storage magnetization 230 of the storage layer 23 is thus the vectorial sum of the first storage magnetization 231 and the second storage magnetization 232. FIG. 3 reports the temperature dependence of the magnetization of the storage layer 23 made from the ferrimagnetic 3d-4f amorphous alloy. More particularly, the figure reports absolute values of a first storage magnetization 231 of the sub-lattice of 3d transition metals atoms, and absolute values of a second storage magnetization 232 of the sub-lattice of 4f transition metals atoms, as a function of temperature. The net storage magnetization 230 as a function of temperature is also reported. In the example of FIG. 3, the respective compositions of the 3d transition metal sub-lattice and the 4f rare-earth material sub-lattice have been chosen such that the first storage magnetization 231 is oriented antiparallel to the second sense magnetization 232. At a compensation temperature $T_{COMP}$ of the storage layer 23, the first storage magnetization 231 and the second storage magnetization 232 have substantially equal amplitudes and opposite signs and are compensated such that the net storage magnetization 230 becomes substantially zero.

The compensation temperature $T_{COMP}$ of the ferrimagnetic storage layer 23 can be adjusted such that it corresponds substantially to the read temperature $T_{read}$ (or low temperature threshold). During the read operation being performed at the read temperature $T_{read}$ (low temperature threshold), the net storage magnetization 230 becomes substantially zero such that no coupling of the sense layer 21 by the storage layer 23 occurs. Consequently, the net sense magnetization 210 can be switched with the first and second read magnetic fields 52, 54 having a lower magnitude.

In yet another embodiment, both the sense layer 21 and the storage layer 23 comprise the ferrimagnetic 3d-4f amorphous alloy. Here, the sense layer 21 comprises the first and second sense magnetizations 211, 212, and the storage layer 23 comprises the first and second storage magnetizations 231, 232. The ferrimagnetic 3d-4f amorphous alloys of the storage layer 23 and the sense layer 21 can be arranged such that the compensation temperature $T_{COMP}$ of the storage layer 23 is greater than the compensation temperature $T_{COMP}$ of the sense layer 21. In a preferred embodiment, the compensation temperature $T_{COMP}$ of the storage layer 23 corresponds substantially to the read temperature $T_{read}$ (or low temperature threshold), and the compensation temperature $T_{COMP}$ of the sense layer 21 corresponds substantially to the high temperature threshold.

REFERENCE NUMBERS 1 magnetic random access memory (MRAM) cell
2 magnetic tunnel junction
21 sense layer
210 net sense magnetization
211 first sense magnetization
212 second sense magnetization
22 tunnel barrier layer
23 storage layer
24 antiferromagnetic storage layer
25 electrode
230 net storage magnetization
231 first storage magnetization
232 second storage magnetization
31 heating current
32 sense current
4 field line
41 write current
42 write magnetic field
5 current line
52 first read magnetic field
54 second read magnetic field
$H_W$ coercive field
$T_{comp}$ compensation temperature
$T_{read}$ read temperature

The invention claimed is:

1. A magnetic random access memory (MRAM) cell comprising a magnetic tunnel junction comprising a storage layer having a net storage magnetization that is adjustable from a first direction to a second direction when the magnetic tunnel junction is at a high temperature threshold and that is pinned at a low temperature threshold; a sense layer having a net sense magnetization that is reversible; and a tunnel barrier layer separating the sense layer from the storage layer;
   at least one of the storage layer and the sense layer comprising a ferrimagnetic 3d-4f amorphous alloy material comprising a sub-lattice of 3d transition metals atoms providing a first magnetization, and a sub-lattice of 4f rare-earth atoms providing a second magnetization, such that at a compensation temperature of said at least one of the storage layer and sense layer, the first magnetization and the second magnetization are substantially equal.

2. MRAM cell according to claim 1, wherein the sense layer comprises the ferrimagnetic 3d-4f amorphous alloy material, the first magnetization being a first sense magnetization and the second magnetization being a second sense magnetization; and wherein the compensation temperature of the sense layer corresponds substantially to the high temperature threshold.

3. MRAM cell according to claim 1, wherein the storage layer comprises the ferrimagnetic 3d-4f amorphous alloy material the first magnetization being a first storage magnetization and the second magnetization being a second storage magnetization; and wherein the compensation temperature of the storage layer corresponds substantially to the low temperature threshold.

4. MRAM cell according to claim 1, wherein the sense layer comprises the ferrimagnetic 3d-4f amorphous alloy material providing the first and second magnetizations, and the storage layer comprises the ferrimagnetic 3d-4f amorphous alloy material providing the first and second magnetizations, and wherein the compensation temperature of the storage layer is greater than the compensation temperature of the sense layer.

5. MRAM cell according to claim 4, wherein the compensation temperature of the storage layer corresponds substantially to the low temperature threshold and the compensation temperature of the sense layer corresponds substantially to the high temperature threshold.

6. MRAM cell according to claim 1, wherein the compensation temperature can be adjusted according to the relative compositions between the transition metal 3d sub-lattice and the rare-earth 4f sub-lattice.

7. MRAM cell according to claim 1, wherein the ferrimagnetic material comprises an alloy containing Co or Fe with Gd, Sm, or Tb.

8. Method for writing a MRAM cell comprising a magnetic tunnel junction comprising a storage layer having a net storage magnetization being adjustable from a first direction to a second direction when the magnetic tunnel junction is at a high temperature threshold and being pinned at a low temperature threshold; a sense layer having a net sense magnetization that is reversible; and a tunnel barrier layer separating the sense layer from the storage layer; at least one of the storage layer and the sense layer comprising a ferrimagnetic 3d-4f amorphous alloy material comprising a sub-lattice of 3d transition metals atoms providing a first magnetization, and a sub-lattice of 4f rare-earth atoms providing a second magnetization, such that at a compensation temperature of said at least one of the storage layer and sense layer, the first magnetization and the second magnetization are substantially equal; the method comprising:
   heating the magnetic tunnel junction to the high temperature threshold;
   once the magnetic tunnel junction has reached the high temperature threshold, switching the magnetization direction of the storage layer to write data to said storage layer;
   the high temperature threshold corresponding substantially to the compensation temperature.

9. A method for reading a MRAM cell comprising a magnetic tunnel junction comprising a storage layer having a net storage magnetization being adjustable from a first direction to a second direction when the magnetic tunnel junction is at a high temperature threshold and being pinned at a low temperature threshold; a sense layer having a reversible net sense magnetization; and a tunnel barrier layer separating the sense layer from the storage layer; at least one of the storage layer and the sense layer comprising a ferrimagnetic 3d-4f amorphous alloy material comprising a sub-lattice of 3d transition metals atoms providing a first magnetization, and a sub-lattice of 4f rare-earth atoms providing a second magnetization, such that at a compensation temperature of said at least one of the storage layer and sense layer, the first magnetization and the second magnetization are substantially equal; the method comprising:

aligning the net sense magnetization in a first direction;
 measuring a first resistance of said magnetic tunnel junction, the first resistance being determined by the first direction of the net sense magnetization relative to the orientation of switched the storage magnetization;
 aligning the net sense magnetization in a second direction;
 measuring a second resistance of said magnetic tunnel junction, the second resistance being determined by the second direction of the net sense magnetization relative to the orientation of the switched storage magnetization;
 determining a difference between the first resistance value and the second resistance value; and
 aligning the net sense magnetization in the first direction and in the second direction being performed at a read temperature below the compensation temperature.

\* \* \* \* \*